US009287824B2

(12) United States Patent
Pohl

(10) Patent No.: US 9,287,824 B2
(45) Date of Patent: Mar. 15, 2016

(54) CIRCUIT ARRANGEMENT FOR CREATING MICROWAVE OSCILLATIONS

(75) Inventor: Nils Pohl, Bochum (DE)

(73) Assignee: KROHNE Messtechnik GmbH & Co. KG, Duisburg (DE)

( * ) Notice: Subject to any disclaimer, the term of this patent is extended or adjusted under 35 U.S.C. 154(b) by 95 days.

(21) Appl. No.: 13/496,004

(22) PCT Filed: Jul. 18, 2011

(86) PCT No.: PCT/EP2011/003584
§ 371 (c)(1),
(2), (4) Date: Mar. 14, 2012

(87) PCT Pub. No.: WO2012/013308
PCT Pub. Date: Feb. 2, 2012

(65) Prior Publication Data
US 2012/0169429 A1    Jul. 5, 2012

(30) Foreign Application Priority Data

Jul. 28, 2010 (DE) .......................... 10 2010 032 574

(51) Int. Cl.
*H03B 5/12* (2006.01)

(52) U.S. Cl.
CPC .............. *H03B 5/125* (2013.01); *H03B 5/1215* (2013.01); *H03B 5/1231* (2013.01); *H03B 5/1243* (2013.01); *H03B 5/1293* (2013.01); *H03B 5/12* (2013.01)

(58) Field of Classification Search
CPC ........ H03B 5/12; H03B 5/125; H03B 5/1243; H03B 5/1215; H03B 5/1231; H03B 5/1293
USPC ...................... 331/117 R, 117 FE, 108 A, 167
See application file for complete search history.

(56) References Cited

U.S. PATENT DOCUMENTS

| 3,504,203 A | * | 3/1970 | Haines ...................... H03F 1/14 257/566 |
| 5,317,287 A | * | 5/1994 | Brown ............................ 331/57 |

(Continued)

FOREIGN PATENT DOCUMENTS

| DE | 10 2008 061 254 A1 | 6/2010 |
| WO | 2009/156793 A1 | 12/2009 |

OTHER PUBLICATIONS

Author: Sean T. Nicolson, Kenneth H. K. Yau, Pascal Chevalier, Alain Chantre, Bernard Sautreuil, Keith W. Tang, Sorin P. Voinigescu Title: Design and Scaling of W-Band SiGe BiCMOS VCOs Date: Sep. 2007; Publisher: IEEE Journal of Solid State Circuits; vol. 42, No. 9.*

(Continued)

*Primary Examiner* — Richard Tan
(74) *Attorney, Agent, or Firm* — Roberts Mlotkowski Safran & Cole, PC; David S. Safran

(57) ABSTRACT

An electronic oscillator of a circuit arrangement for creating microwave oscillations with two transistors as amplifier elements and with a resonator (4), wherein the resonator has two emitter impedance networks, the base impedance network and/or an emitter impedance network or both emitter impedance networks can be put out of tune and the transistors each have a parasitic base collector capacitance. The repercussion of the load on the electronic oscillator ("load-pulling") is greatly reduced so as to be eliminated as much as possible, in that a compensation capacitance is switched between the collector of the first transistor and the base of the second transistor as well as between the collector of the second transistor and the base of the first transistor, and the compensation capacitances are implemented by reverse-biased pn-junctions.

3 Claims, 3 Drawing Sheets

(56) References Cited

U.S. PATENT DOCUMENTS 6,731,182 B2 5/2004 Sakurai
7,116,183 B2 10/2006 Wu
2004/0108908 A1* 6/2004 Lazarescu et al. ........ 331/117 R

OTHER PUBLICATIONS

Author: Malcolm D. Stewart Title: "A 20-GHz Bipolar Varactor-Tuned VCO using Switched Capacitors to Add Tuning Range" Date: 2003; Publisher: Carleton University, Canada; Pertinent pp. 1-143.*

U. Tietze and CH. Schenk, Halbleiter-Schaltungstechnik, Standard Volume 12th Edition, Springer-Verlag, pp. 316 and 317, Discussed in Present Specification.

John M. Miller, Dependence of the Input Impedance of a Three-Electrode Vacuum Tube Upon the Load in the Plate Circuit, Scientific Papers of the Bureau of Standards, 15(351): 1920, pp. 368-385.

Hao Li, Hans-Martin Rein, Thomas Suttorp, and Josef Böck, Fully Integrated SiGe VCOs With Powerful Output Buffer for 77-GHz Automotive Radar Systems and Applications Around 100 GHz; IEEE Journal of Solid-State Circuits, vol. 39, No. 10, Oct. 2004, pp. 1650-1658.

* cited by examiner

CIRCUIT ARRANGEMENT FOR CREATING MICROWAVE OSCILLATIONS

BACKGROUND OF THE INVENTION

1. Field of the Invention

The invention relates to a circuit arrangement for creating microwave oscillations having an electronic oscillator with two transistors and a resonator, preferably with a base impedance network and with two emitter impedance networks, wherein the base impedance network and/or an emitter impedance network or both emitter impedance networks can be put out of tune, wherein the transistors each have a parasitic base collector capacitance and wherein a compensation capacitance is switched between each the collector of the first transistor and the base of the second transistor as well as the collector of the second transistor and the base of the first transistor.

2. Description of Related Art

A circuit arrangement of the type to which this invention is directed is known from the German Patent Application 10 2008 061 254. The creation of microwave oscillations, i.e., of high frequency to highest frequency electric oscillations, for example, up to about 80 GHz or even up to 100 GHz, is central to many different applications. In this manner, extremely stable microwave oscillations are required by, e.g., radar systems for measuring distances and for measuring speeds. Such microwave oscillations are also needed for other measuring devices and for communication applications.

An electronic oscillator is normally used for creating microwave oscillations, which can be implemented either as a monolithic integrated circuit on a chip or as a hybrid circuit on a printed circuit board. According to Barkhausen's formula, these electronic oscillators—as all electronic oscillators—have at least one amplifier element, in particular—for decades—a semiconductor device as amplifier component. In particular, the amplifier element can be a transistor—of any type. A resonator further belongs to the electronic oscillator—again as all electronic oscillators—that determines the frequency of the electronic oscillator. At least one tunable impedance is necessary for electronic oscillators, in which the frequency of the microwave oscillations can be set. A tunable capacitance, a varicap, is often used as tunable impedance. By changing the control voltage on the varicap, the relevant capacitance changes and, thus, also the frequency of the electronic oscillator. In the ideal case, the frequency of the electronic oscillator is only changed via the control voltage on the varicap and the frequency of the electronic oscillator does not depend on further factors. In reality, however, further factors influence the behavior of the electronic oscillator, in particular the frequency of the electronic oscillator, such as the supply voltage of the electronic oscillator, the current temperature or the outer load on the electronic oscillator. This influence can be partially compensated with phase control. However, the influence of the outer load on the electronic oscillator, the load repercussion, cannot be compensated with phase control.

An insufficient decoupling of the electronic oscillator from the outer load results in that the outer load, which, for example, can be a longer connecting line, additionally acts as a resonator for the electronic oscillator. This parasitic resonator can, in many cases, have a substantially better quality factor than the actual resonator of the electronic oscillator. However, this improvement of the quality factor is only effective at certain frequencies, at other frequencies the overall quality factor of the electronic oscillator is considerably downgraded by the external resonator. Consequently, a modulation of the phase noise results via the frequency of the electronic oscillator. In extreme cases, the tuning characteristic of the frequency of the electronic oscillator can exhibit skips via the control voltage. A small change in the control voltage can lead to a sudden skip of the frequency of the electronic oscillator. This can go so far that the tuning characteristic is not unambiguous, so that tuning in different direction leads to a hysteresis in the tuning characteristic. As a result, the electronic oscillator can no longer be tuned smoothly. In addition, a sudden switch of the load, for example, by switching between different antennae, can put the electronic oscillator out of tune. However, even in electronic oscillators having phase control these skips as well as too strong phase noise can lead to the phase control no longer being capable of stabilizing the electronic oscillator, so that the entire circuit arrangement is no longer functional. In order to prevent this effect, which is called "load-pulling" in technical literature, a stronger decoupling of the electronic oscillator from its outer load is necessary. Insofar, there are three types of solutions that are often combined for use:

The first solution is a passive, reciprocal decoupling. Here, a passive, reciprocal decoupling network is switched between the load and the electronic oscillator. This can, for example, be implemented with a damping member, with a voltage divider or with a simple resistor switched in series or parallel to the load. A passive decoupling always results in a reduction of the available output lines of the electronic oscillator, since the reverse isolation of the passive, reciprocal decoupling network is always identical to the damping of the output signal.

A second solution is a passive, non-reciprocal decoupling. Here, in turn, passive decoupling networks are used, however with non-reciprocal components such as isolators, circulators or ferrites. With these components, it is possible to achieve a reverse isolation, which can be considerably greater than the damping of the output signal of the electronic oscillator. The output line of the electronic oscillator remains essentially intact. However, non-reciprocal components can only be implemented with considerable effort. Integration on one chip is not possible with reasonable effort, integration on a printed circuit board is costly.

The third solution is active decoupling. Here, an active circuit of semiconductor devices, e.g., transistors, is switched between the load and the electronic oscillator. This circuit often even acts as an amplifier; for this reason, the term separation amplifier is often used. These circuits can achieve a large reverse isolation without damping the output signal of the electronic oscillator. However, additional power is principally needed for operating an active decoupling, which then increases the overall power loss. In many applications, the power consumption of the separation amplifier exceeds that of the actual electronic oscillator, since the separation amplifier is run in multiple steps for good decoupling.

In order to implement electronic oscillators in the millimeter wave range, monolithic integrated circuits are often used. In these circuits, a complete symmetrical structure is usually chosen. This is referred to as a differential circuit design. This prior art will be described in the following in conjunction with FIG. 1; here, FIG. 1a) shows the principal and FIG. 1b) a typical implementation.

FIG. 1 shows an electronic oscillator 1 of a circuit arrangement for creating microwave oscillations having two amplifier elements, namely with two transistors 2 and 3 and with a resonator 4. In the electronic oscillator 1 shown in FIG. 1, the resonator 4 has a base impedance network 5 and two emitter impedance networks 6 and 7. It is not shown that the base impedance network 5, one emitter impedance network 6 or 7, both emitter impedance networks 6, 7 or the base impedance network 5 and the emitter impedance networks 6 and 7 can be tuned. The base impedance network 5 and the emitter impedance networks 6, 7 do not determine only the frequency of the electronic oscillator 1, they also determine the biasing of the transistors 2, 3. The base impedance network 5 and the emitter impedance networks 6 and 7 do not have to be implemented separately, a coupling is also possible. In order to fulfill the oscillation requirements, the base impedance network 5 should act primarily inductively and the emitter impedance networks 6, 7 should act primarily capacitively. A current has to be fed into the transistors 2 and 3 via the emitter impedance networks 6 and 7. When the oscillation requirements are fulfilled, this provides for a push-pull oscillation, i.e., the transistors 2 and 3 work shifted exactly half of a period.

In the implementation shown in FIG. 1b) of the electronic oscillator 1 shown as a principal in FIG. 1a), the base impedance network 5 consists of two inductances 8, 9, while both emitter impedance networks 6 and 7 consist of two capacitances 10, 11 and of two inductances 12, 13. The inductances 12, 13 are very large and act primarily to feed current into the transistors 2, 3.

In the embodiment shown in FIG. 1 of an electronic oscillator 1 belonging to a circuit arrangement for creating microwave oscillations, FIG. 1a) principal representation, FIG. 1b) typical representation, the output signal of the electronic oscillator 1 is decoupled via the collectors 14, 15 of the transistors 2, 3 and is typically led via a matching network (not shown) and an output buffer (not shown) to the load (also not shown). This decoupling via the collectors 14, 15 of the transistors 2, 3 causes a very good decoupling in the ideal case. However, the transistors 2, 3 each have a parasitic base collector capacitance (not shown). The parasitic base collector capacitances cause a strong repercussion of the load on the electronic oscillator 1, especially at high frequencies.

Based on the prior art described above in detail, there has been an effort to reduce, or as far as possible, to eliminate the described disadvantageous repercussion of the load on the electronic oscillator, and thus, on the circuit arrangement for creating microwave oscillations to which the electronic oscillator belongs. This has been attempted in that a compensation capacitance is switched between the collector of the first transistor and the base of the second transistor as well as between the collector of the second transistor and the base of the first transistor and the compensation capacitances are about as large as the parasitic base collector capacitances (compare the German Patent Application 10 2008 061 254). This has the effect that a signal, which is coupled by the load of the electronic oscillator, is eliminated to the greatest possible extent. The signal, which is coupled by the load of the electronic oscillator, is coupled at the same phase on both sides. Since the electronic oscillator oscillates push-pull, the signal coupled to the load in the electronic oscillator does not emerge in the differential signal, i.e., in the output signal.

The basic possibility for compensating the influence of the base collector capacitance has also already been described in literature ("Design and Scaling of W-Band SiGe BiCMOS VCOs" in the "IEEE Journal of Solid-State Circuits", vol. 42, No. 9, September 2007). This compensation is also used in the prior art in order to compensate for the Miller effect, and thus, to increase the frequency of an electronic oscillator (compare here pages 316 and 317 in the standard volume "Halbleiter-Schaltungstechnik" by Dr.-Ing. Ulrich Tietze and Dr. Christoph Schenk, 12$^{th}$ Edition, Springer-Verlag and "Dependence of the input impedance of a three-electrode vacuum tube upon the load in a plate circuit" in "Scientific Papers of the Bureau of Standards" 15(351): 367-385, 1920). However, a Miller effect only occurs when a voltage amplifier occurs between the base nodes and the collector nodes of a transistor, which is not the case in many dimensions.

Due to the decreased repercussion of the load on the electronic oscillator, called load repercussion in the following, it is possible, compared to other circuit designs (compare "Fully Integrated SiGe VCOs With Powerful Output Buffer for 77-GHz Automotive Radar Systems and Applications Around 100 GHz" in "IEEE Journal of Solid-State Circuits", vol. 39, No. 10, October 2004), to substantially simplify the output buffer and to reduce the required power dissipation, through which, inter alia, the effort for heat dissipation is considerably reduced and the reliability of the electronic oscillator—and thus the circuit arrangement according to the invention for creating microwave oscillations—can be increased. Especially in battery-operated circuit arrangements, the power provided is limited so that, in particular, the decrease in the required power dissipation has a positive impact.

The described reduction of the load repercussion reduces the load repercussion in a typical implementation of the reverse isolation, as described in the introduction with the term "load-pulling", at a factor of 5 to 10.

SUMMARY OF THE INVENTION

As described in the introduction, the invention relates to a circuit arrangement for creating microwave oscillations having an oscillator with two transistors as amplifier elements and having a resonator, wherein the resonator preferably has a base impedance network and two emitter impedance networks and wherein the base impedance network and/or an emitter impedance network can be tuned.

It cannot be learned from the prior art on which the invention is based as to how to implement compensation capacitances in detail, so that a first object of the present invention is to provide a solution as to how implementation of compensation capacitances can be achieved.

The parasitic base collector capacitance from the transistors is caused by two effects. First, the reverse biased pn-junction causes a junction capacitance between the base and the collector, which is dependent on the temperature and the reverse voltage. Second, a constant capacitance acts between the lines to the base and the collector.

In the simplest case, the compensation capacitance can be implemented as a constant capacitance between two metal electrodes. This can occur in an integrated circuit either horizontally between two metal plates (called metal-isolator-metal=MIM) or the capacitance—usually in very finely structured processes—between two metal lines in the same plane in the vertical direction is used (called vertical-parallel-plate=VPP). These two solutions lead to a compensation capacitance with high quality.

According to the invention, the compensation capacitances are initially implemented by reverse-biased pn-junctions.

For the capacitance $C_{sp}$ of a reverse-biased pn-junction:

$$C_{sp} = \frac{C_{sp,0}}{\left(1 + \frac{U_{sp}}{U_D}\right)^m}$$

Here, $U_{sp}$ is the reverse voltage at the pn-junction, m is a constant (depending on the doping profile, about 0.5) $C_{sp,0}$ is also a constant (depending on the surface and the doping of the pn-junction) and $$U_D = \frac{k \cdot T}{e} \ln\left(\frac{N_D N_A}{n_i^2}\right)$$

with k and e as natural constants, T is the temperature at the pn-junction, $N_A$ and $N_D$ are dope concentrations and $N_i$ is the intrinsic density. Here, a compensation capacitance is the result, which, on the one hand, is dependent on biasing, reverse voltage $U_{sp}$ and temperature T, and on the other hand, on technological and geometrical sizes. Since the paths of the semiconductor additionally have ohmic losses, a compensation capacitance of a lower quality than in a metallic compensation capacitance is normally the result as is described further above. However, it has been shown that the quality of the compensation capacitance implemented by reverse-biased pn-junctions is sufficiently large.

A particularly preferred embodiment of the implementation of the compensation capacitance according to the invention is characterized in that reverse-biased pn-junctions—provided as compensation capacitances—are implemented in the same manner as the parasitic base collector capacitances of the transistors belonging to the electronic oscillator. This has different advantages:

First, both capacitances, i.e., the compensation capacitance as well as the parasitic base collector capacitances of the transistors provide identical compensation of junction capacitance and constant wiring capacitance. Furthermore, identical capacitances result from the identical implementation—even with process fluctuations of doping concentrations and geometric expansion—since both capacitances are mainly identically influenced (called matching). Finally, temperature fluctuations and the biasing are identical on both pn-junctions, so that both capacitances always remain identical.

The identical implementation of the compensation capacitances and the parasitic base collector capacitances of the transistors can be achieved in that the pn-junctions of transistors, which are identical to the transistors belonging to the electronic oscillator, are implemented as pn-junctions constituting the compensation capacitances realized. Here, each emitter of the transistors, whose compensation capacitance is implemented as pn-junction, is short-circuited with its base.

Compensation capacitances that can function independent of external fluctuations can be implemented with that, which was previously described, which is not possible with constant compensation capacitances.

In the implementation of the circuit arrangement according to the invention, it is important to take care, in particular for use in creating very high-frequency microwave oscillations, that line lengths are particularly short between the transistors belonging to the electronic oscillator and the pn-junctions constituting the compensation capacitances. However, even when an extremely compact layout is the goal of the implementation, a parasitic series inductance results from the necessary wiring. Due to this additional parasitic series inductance a capacitive effect with an increasing effective capacitance $C_{m,eff}$ is the result below the resonance frequency of the series oscillating circuit for which:

$$C_{M,eff} = \frac{C_M}{1 - \omega^2 \cdot C_M \cdot L_{par}}$$

where $C_m$ is the compensation capacitance and $L_{par}$ is the parasitic series inductance. For a dimension that can be implemented, electromagnetic field simulations have a parasitic series inductance $L_{par}$ of about 23 pH, so that by using a compensation capacitance $C_m$ of 31 fF at 80 GHz results in an effective compensation capacitance of 37 fF.

The further object of reducing the load repercussion on the electronic oscillator is met with that, which is described above in that the compensation capacitances are a certain measure smaller than the parasitic base collector capacitances of the transistors belonging to the electronic oscillator. In detail, as described above, the compensation capacitances are chosen so that the effective compensation capacitances resulting from parasitic series inductance are essentially as large as the parasitic base collector capacitance of the transistors belonging to the electronic oscillator. In general, it can be said that the compensation capacitances should be about 10% to 30%, preferably 20% less than the parasitic base collector capacitances of the transistors belonging to the electronic oscillator.

In detail, there are different possibilities for designing and further developing the circuit arrangement according to the invention for creating microwave oscillations, or respectively, the electronic oscillator belonging to it. Here, reference is made to the embodiments described below and shown in the accompanying drawings.

DETAILED DESCRIPTION OF THE INVENTION

Figure 2:
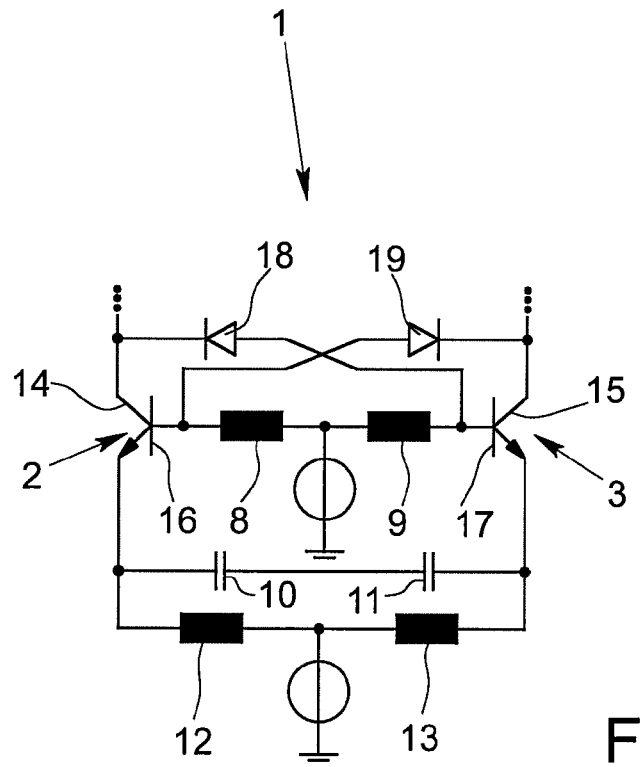
FIG. 2 shows a first embodiment of an electronic oscillator of a circuit arrangement according to the invention.
Figure 3:
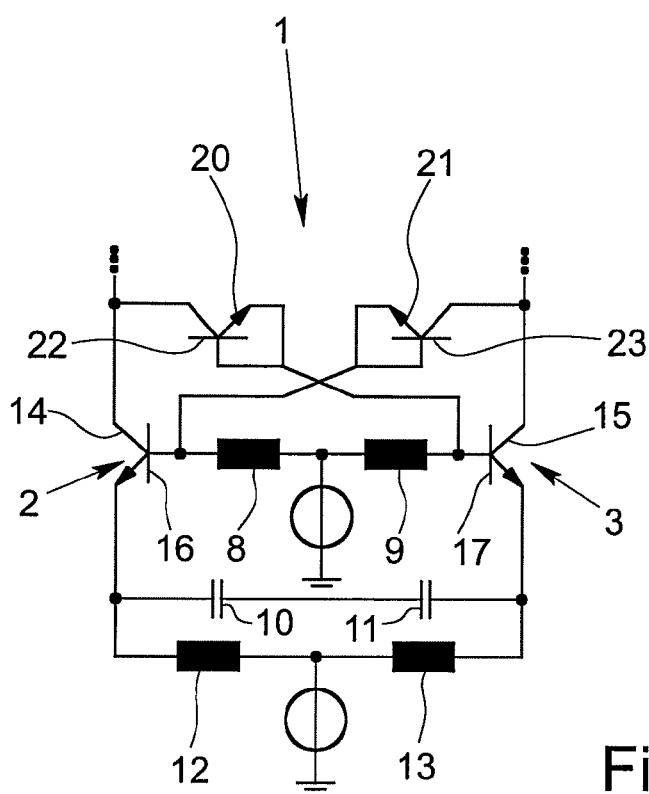
FIG. 3 shows a second embodiment of an electronic oscillator of a circuit arrangement according to the invention.

FIGS. 2 and 3 show electronic oscillators 1 belonging to circuit arrangements for creating microwave oscillations of the present invention.

Figure 1:
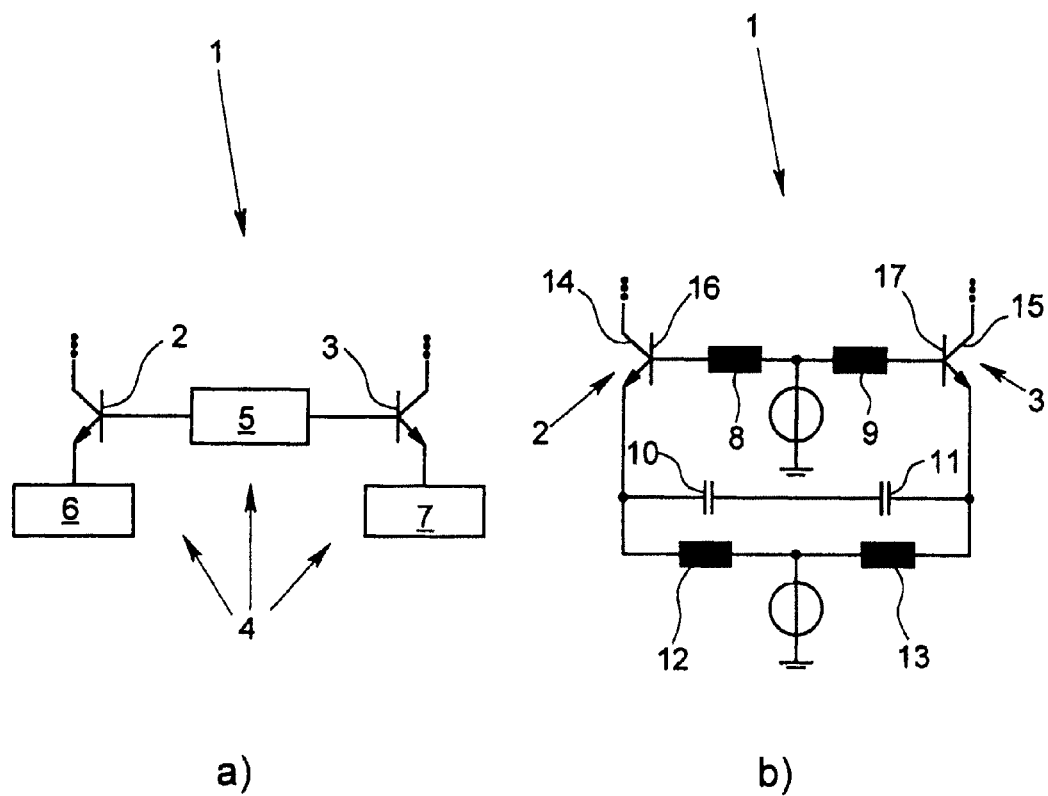
FIGS. 1a & 1b show, respectively, the principal and a typical implementation of a known electronic oscillator of a circuit arrangement for creating microwave oscillations.

Two amplifier elements belong to each electronic oscillator 1, namely two transistors 2, 3 and a resonator 4. In the illustrated embodiments, the resonator 4 has a base impedance network 5 and two emitter impedance networks 6, 7. What is not shown is that the base impedance network 5, an emitter impedance network 6 or 7, both emitter impedance networks 6, 7 or the base impedance network 5 and the emitter impedance networks 6, 7 can be tuned. In addition to the electronic oscillator 1 shown in FIGS. 2 & 3, the electronic oscillator 1 described above and shown in FIG. 1 is referred to.

As shown in FIGS. 2 and 3, a compensation capacitance 18 is connected between the collector 14 of the first transistor 2 and the base 17 of the second transistor 3 and a compensation capacitance 19 is connected between the collector 15 of the second transistor 3 and the base 18 of the first transistor 2.

What is not shown is that the electronic oscillator 1 can have output buffers, namely transistors operated in the common base circuit. What is also not shown is that the principle used for reducing the load repercussion, i.e., for reducing "load-pulling", rephrased: to achieve reverse isolation so to speak the compensation by the described and shown compensation capacitances of the effect of parasitic base collector capacitances in the transistors belonging to the electronic oscillators can be otherwise used in circuit arrangements according to the invention for creating microwave oscillations in order to further improve the reverse isolation, that, for example, a difference amplifier can be switched after the electronic oscillator. Insofar—in order to avoid repetition—please refer to the German Patent Application 10 2008 061 254.

According to the invention, the compensation capacitances 18, 19 are implemented by reverse-biased pn-junctions, i.e., by reverse-biased diode paths, or respectively, diode paths loaded in the reverse direction.

In the embodiment of FIG. 2, the compensation capacitances 18, 19 are implemented as reverse-biased diodes, i.e., loaded in the reverse direction. In contrast, the compensation capacitances 18, 19 according to FIG. 3 are implemented in the same manner as the parasitic base collector capacitances of the transistors 2, 3 of the electronic oscillator 1. It is of particular advantage if the pn-junctions constituting the compensation capacitances 18, 19 are realized as pn-junctions of transistors, which are identical to the transistors 2, 3 of the electronic oscillator 1. This has the advantage that has already been described above.

In the embodiment according to FIG. 3, in which the reverse-biased pn-junctions constituting the compensation capacitances 18, 19 are implemented in the same manner as the parasitic base collector capacitances of the transistors 2, 3 of the electronic oscillator 1, each emitter 20, 21 of the transistors, whose pn-junctions constitute compensation capacitances 18, 19, is short-circuited with its base 22 or 23, respectively.

Figure 4:
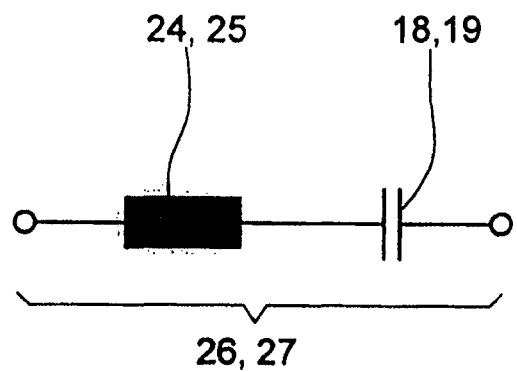
FIG. 4 is representation for the use compensation capacitances to compensate for parasitic capacitances.

It is described above that even if, in the implementation of the circuit arrangement according to the invention, an extremely compact layout is implemented, as represented in FIG. 4, parasitic series inductance 24 or 25 result from the necessary wiring, which result in series oscillating circuits 26 or 27 with the compensation capacitance 18 or 19. This leads to an increased effective capacitance of the compensation capacitance 18 or 19 below the resonance frequency of the series oscillating circuit 26 or 27. Taking this into consideration, a further teaching of the invention, which is of significance even independent of the above-described aspects, focuses on implementing the capacitance value of the compensation capacitances 18 and 19 a certain measure smaller than the capacitance values of the parasitic base collector capacitances of the transistors 2, 3 of the electronic oscillator 1. Preferably, the capacitance values of the compensation capacitances 18, 19 are chosen so that the effective capacitances of the compensation capacitances 18, 19 resulting due to the parasitic series inductances 24, 25 are essentially as large as the capacitance values of the parasitic base collector capacitances of the transistors 2, 3 of the electronic oscillator 1.

The measure that the capacitance values of the compensation capacitances 18, 19 are to be less than the capacitance values of the parasitic base collector capacitances of the transistors 2, 3 of the electronic oscillator 1 can be determined by electromagnetic field simulations. Normally, the resulting capacitance values of the compensation capacitances 18, 19 are about 10% to 30%, preferably about 20% less than the capacitance values of the parasitic base collector capacitances of the transistors 2, 3 of the electronic oscillator 1.

The implementation of this additional feature can be achieved by means of an integrated circuit by scaling the transistor size. If, e.g., the transistors 2, 3 of the electronic oscillator 1 each have an emitter surface of $A_E = 2 \times 0.35$ μm×10 μm, transistors for implementing the compensation capacitances 18, 19 can be implemented with an emitter surface of $A_E = 2 \times 0.35$ μm×8.2. Here, it should be taken into consideration that, in a layered construction of bipolar transistors, the surface of the base emitter boundary layer is identical to the surface of the collector base boundary layer.

Figure 5:
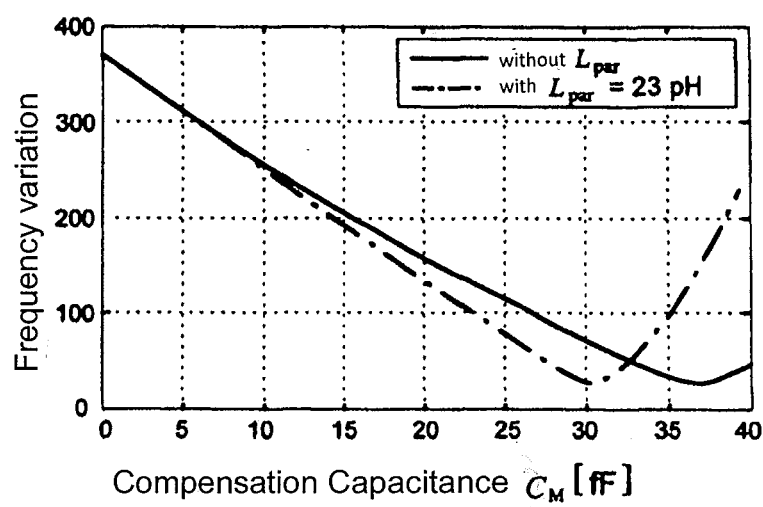
FIG. 5 is a graph representing the effect of the present invention.

The efficiency of the compensation depending on the capacitance value of the compensation capacitances 18, 19 is shown in FIG. 5. The result is a substantial reduction of the load repercussion. By taking into consideration the parasitic series inductances 24, 25, the optimum is shifted further to the left and it becomes thinner, so that the circuit arrangement reacts more sensitively to production tolerances, temperature changes and biasing.

In detail, FIG. 5 shows the simulation of frequency variations (frequency pulling $\delta f_{FP}$) by a mismatched load (−12 dB) as a function of the compensation capacitance $C_M$, on the one hand and, on the other hand, without the parasitic series inductance $L_{par}$, wherein a parasitic inductance $L_{par}$ of about 23 pH is assumed.

What is claimed is:

1. A circuit arrangement for creating microwave oscillations, comprising: an electronic oscillator with a first transistor, a second transistor and a resonator,
wherein the first transistor and the second transistor each comprise a base, an emitter, a collector and a base collector junction that establishes a parasitic base collector capacitance,
wherein a first compensation capacitance is connected between the collector of the first transistor and the base of the second transistor and a second compensation capacitance is connected between the collector of the second transistor and the base of the first transistor,
wherein each of the first compensation capacitance and the second compensation capacitance is preset to a capacitance value that is less than a capacitance value of the parasitic base collector capacitance of each of the first transistor and the second transistor, and
wherein the capacitance value of each of the first compensation capacitance and the second compensation capacitance has been set to produce an effective capacitance value due to parasitic series inductances that is essentially as large as the capacitance value of the parasitic base collector capacitance of each of the first transistor and the second transistor.

2. The circuit arrangement according to claim 1, wherein the capacitance value of each of the first compensation capacitance and the second compensation capacitance is about 10% to 30% less than the capacitance value of the parasitic base collector capacitance of each of the first transistor and second transistor.

3. The circuit arrangement according to claim 1, wherein the capacitance value of each of the first compensation capacitance and second compensation capacitance is about 20% less than the capacitance value of the parasitic base collector capacitance of each of the first transistor and second transistor.

* * * * *